(12) United States Patent
Babich et al.

(10) Patent No.: US 8,497,212 B2
(45) Date of Patent: Jul. 30, 2013

(54) FILLING NARROW OPENINGS USING ION BEAM ETCH

(75) Inventors: Katherina E. Babich, Chappaqua, NY (US); Alessandro C. Callegari, Yorktown Heights, NY (US); Christopher D. Sheraw, Wappingers Falls, NY (US); Eugene J. O'Sullivan, Nyack, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 177 days.

(21) Appl. No.: 13/036,113

(22) Filed: Feb. 28, 2011

(65) Prior Publication Data

US 2012/0217590 A1 Aug. 30, 2012

(51) Int. Cl.
*H01L 21/302* (2006.01)
*H01L 21/461* (2006.01)

(52) U.S. Cl.
USPC ........... 438/713; 438/585; 438/592; 438/702; 257/E21.632; 257/E21.249

(58) Field of Classification Search
USPC ................. 438/197, 199, 585, 592, 713, 702, 438/706, 926; 257/E21.632, E21.249
See application file for complete search history.

(56) References Cited

U.S. PATENT DOCUMENTS

| | | | |
|---|---|---|---|
| 2002/0004278 A1* | 1/2002 | Gutsche | 438/396 |
| 2006/0040485 A1* | 2/2006 | Lee et al. | 438/597 |
| 2011/0186915 A1* | 8/2011 | Scheiper et al. | 257/288 |

* cited by examiner

*Primary Examiner* — Michelle Mandala
(74) *Attorney, Agent, or Firm* — Williamson, Morgan & Amerson, P.C.

(57) ABSTRACT

Generally, the subject matter disclosed herein relates to modern sophisticated semiconductor devices and methods for forming the same, wherein a multilayer metal fill may be used to fill narrow openings formed in an interlayer dielectric layer. One illustrative method disclosed herein includes forming an opening in a dielectric material layer of a semiconductor device formed above a semiconductor substrate, the opening having sidewalls and a bottom surface. The method also includes forming a first layer of first fill material above the semiconductor device by forming the first layer inside the opening and at least above the sidewalls and the bottom surface of the opening. Furthermore, the method includes performing a first angled etching process to at least partially remove the first layer of first fill material from above the semiconductor device by at least partially removing a first portion of the first layer proximate an inlet of the opening without removing a second portion of the first layer proximate the bottom of said opening, and forming a second layer of second fill material above the semiconductor device by forming the second layer inside the opening and above the first layer.

24 Claims, 9 Drawing Sheets

FILLING NARROW OPENINGS USING ION BEAM ETCH

BACKGROUND

1. Field of the Disclosure

Generally, the present disclosure relates to sophisticated integrated circuits, and, more particularly, to filling narrow openings formed in a semiconductor device using by using an ion beam etching step.

2. Description of the Related Art

The fabrication of advanced integrated circuits, such as CPU's, storage devices, ASIC's (application specific integrated circuits) and the like, requires the formation of a large number of circuit elements on a given chip area according to a specified circuit layout, wherein field effect transistors represent one important type of circuit elements that substantially determine performance of the integrated circuits. Generally, a plurality of process technologies are currently practiced, wherein, for many types of complex circuitry, including field effect transistors, MOS technology is currently one of the most promising approaches due to the superior characteristics in view of operating speed and/or power consumption and/or cost efficiency. During the fabrication of complex integrated circuits using, for instance, MOS technology, millions of transistors, e.g., N-channel transistors and/or P-channel transistors, are formed on a substrate including a crystalline semiconductor layer. A field effect transistor, irrespective of whether an N-channel transistor or a P-channel transistor is considered, typically comprises so-called PN junctions that are formed by an interface of highly doped regions, referred to as drain and source regions, with a slightly doped or non-doped region, such as a channel region, disposed adjacent to the highly doped regions.

In a field effect transistor, the conductivity of the channel region, i.e., the drive current capability of the conductive channel, is controlled by a gate electrode formed adjacent to the channel region and separated therefrom by a thin insulating layer. The conductivity of the channel region, upon formation of a conductive channel due to the application of an appropriate control voltage to the gate electrode, depends on the dopant concentration, the mobility of the charge carriers and, for a given extension of the channel region in the transistor width direction, on the distance between the source and drain regions, which is also referred to as channel length. Hence, in combination with the capability of rapidly creating a conductive channel below the insulating layer upon application of the control voltage to the gate electrode, the conductivity of the channel region substantially affects the performance of MOS transistors. Thus, as the speed of creating the channel, which depends on the conductivity of the gate electrode, and the channel resistivity substantially determine the transistor characteristics, the scaling of the channel length, and associated therewith the reduction of channel resistivity and increase of gate resistivity, is a dominant design criterion for accomplishing an increase in the operating speed of the integrated circuits.

For many device technology generations, the gate electrode structures of most transistor elements has comprised silicon-based materials, such as a silicon dioxide and/or silicon oxynitride gate dielectric layer, in combination with a polysilicon gate electrode. However, as the channel length of aggressively scaled transistor elements has become increasingly smaller, many newer generation devices have turned to gate electrode stacks comprising alternative materials in an effort to avoid the short-channel effects which may be associated with the use of traditional silicon-based materials in reduced channel length transistors. For example, in some aggressively scaled transistor elements, which may have channel lengths of 14-32 nm or even shorter, gate electrode stacks comprising a so-called high-k dielectric/metal gate (HK/MG) configuration have been shown to provide significantly enhanced operational characteristics over the heretofore more commonly used silicon dioxide/polysilicon (SiO/poly) configurations.

Depending on the specific overall device requirements, several different high-k materials—i.e., materials having a dielectric constant, or k-value, of approximately 10 or greater—have been used with varying degrees of success for the gate dielectric layer of an HK/MG gate electrode structure. For example, in some transistor element designs, a high-k gate dielectric layer may include tantalum oxide ($Ta_2O_5$), strontium titanate ($SrTiO_3$), hafnium oxide ($HfO_2$), zirconium oxide ($ZrO_2$), titanium oxide ($TiO_2$), aluminum oxide ($Al_2O_3$), yttrium oxide ($Y_2O_3$), lanthanum oxide ($La_2O_5$), hafnium silicates ($HfSiO_x$), hafnium silicon oxynitrides ($HfSiO_xN_y$), and the like. Furthermore, one or more of a plurality of different non-polysilicon metal gate electrode materials may be used in HK/MG configurations so as to control the work function of the transistor, as will be discussed in more detail below. These metal gate electrode materials may include, for example, titanium nitride (TiN), titanium oxynitride (TiON), titanium oxycarbide (TiOC), titanium oxycarbonitride (TiOCN), titanium aluminum (TiAl) tantalum silicon nitride (TiSiN), tantalum (Ta), tantalum nitride (TaN), tantalum carbide (TaC), tantalum carbonitride (TaCN), tantalum silicon nitride (TaSiN), tantalum silicide (TaSi), aluminum nitride (AlN), tungsten (W), molybdenum (Mo), hafnium nitride (HfN), hafnium silicide (HfSi), titanium (Ti), aluminum (Al), platinum (Pt), rubidium (Ru), iridium (Ir) and the like.

One processing method that has been used for forming high-k/metal gate transistor elements is the so-called "gate last" or "replacement gate" technique. FIGS. 1a-1e depict one illustrative prior art method for forming an HK/MG gate electrode structure based on the replacement gate technique, which will now be described in further detail.

Figure 1A:
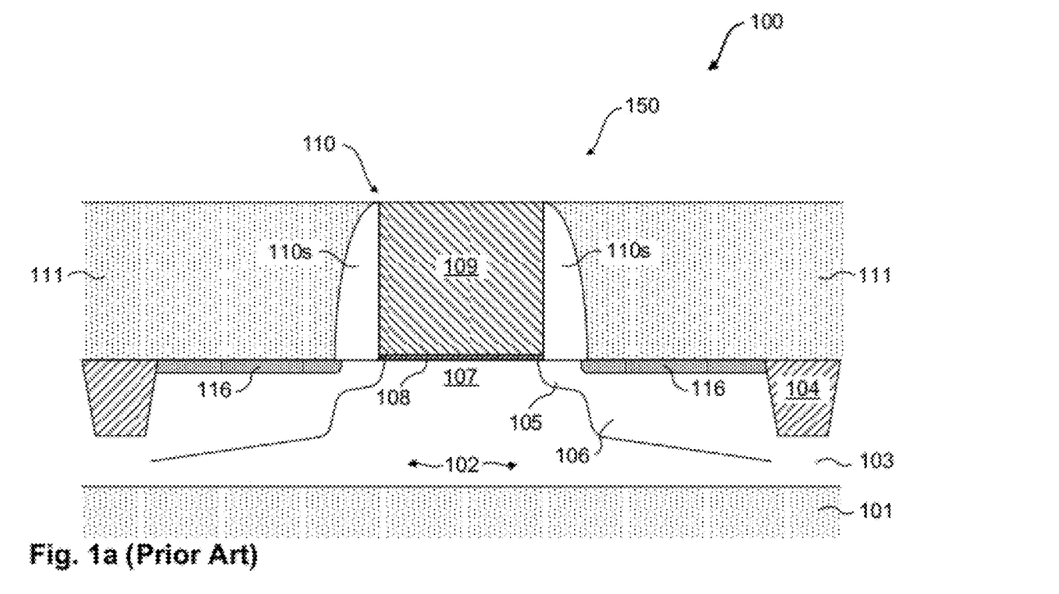
FIGS. 1a-1e schematically illustrate a process flow of an illustrative prior art method for forming replacement metal gate electrodes in a semiconductor device.

FIG. 1a schematically shows a cross-sectional view of an illustrative semiconductor device 100 comprising a substrate 101, in and above which an illustrative transistor element 150 may be formed based on well-established semiconductor device processing techniques. The illustrative transistor element 150 may include a gate electrode structure 110, and the substrate 101 may represent any appropriate substrate on which may be formed a semiconductor layer 103, such as a silicon-based layer, or any other appropriate semiconductor material that facilitates the formation of the illustrative MOS transistor element 150. It should be appreciated that the semiconductor layer 103, even if provided as a silicon-based layer, may include other materials, such as germanium, carbon and the like, in addition to an appropriate dopant species for establishing the requisite conductivity type in an active region 102 of the semiconductor layer 103. Furthermore, in some illustrative embodiments, the transistor element 150 may be formed as one of a plurality of bulk transistors, i.e., the semiconductor layer 103 may be formed on or be part of a substantially crystalline substrate material, while in other cases specific device regions of the device 100 or the entire device 100 may be formed on the basis of a silicon-on-insulator (SOI) architecture, in which a buried insulating layer (not shown) may be provided below the semiconductor layer 103.

As shown in FIG. 1a, the active region 102 is typically enclosed by an isolation structure 104, which in the present example may be provided in the form of a shallow trench isolation that is typically used for sophisticated integrated circuits. In the illustrated embodiment, highly doped source and drain regions 106, including extension regions 105 that usually comprise a dopant concentration less than the highly doped regions 106, are formed in the active region 102. The source and drain regions 106, including the extension regions 105, are laterally separated by a channel region 107. Furthermore, the source and drain regions 106 may also comprise metal silicide contact regions 116, which may facilitate the formation of electrical contacts to the transistor element 150. The gate electrode structure 110 is formed above the channel region 107 and may be made up of a gate insulation layer 108, which electrically and physically isolates a dummy gate electrode 109 from the underlying channel region 107, as well as sidewall spacer structures 110s formed on the sidewalls of the dummy gate electrode 109. Depending on the device requirements and/or the process strategy, the sidewall spacer structures 110s may include two or even more spacer elements, such as offset spacers, conformal liners, and the like, which may act as appropriate implantation masks for creating the lateral dopant profile for the highly doped drain and source regions 106 and extension regions 105.

In the HK/MG replacement gate technique, the gate insulation layer 108 may be made up of a high-k dielectric material such as tantalum oxide, strontium titanium oxide, hafnium oxide, hafnium silicate, zirconium oxide and the like, and the dummy gate electrode 109 may comprise, for example, polysilicon. Furthermore, in some embodiments, an ultrathin interfacial layer (not shown) may be present above the active region 102, between the gate insulation layer 108 and the underlying channel region 107. Depending on the device requirements, the ultrathin interfacial layer may comprise a silicon-based dielectric material, such as silicon dioxide, silicon oxynitride and the like, and may have a thickness of approximately 0.1-0.8 nm, whereas in specific embodiments the ultrathin interfacial layer may be approximately 0.3-0.5 nm.

As illustrated in FIG. 1a, the semiconductor device 100 may also comprise an interlayer dielectric material layer 111, which may act to electrically isolate the transistor element 150 from any subsequently formed metallization layers (not shown). The interlayer dielectric material layer 111 may in some embodiments comprise silicon dioxide, silicon nitride, silicon oxynitride, and the like, or a combination of these commonly used dielectric materials. Depending on the device design and overall process flow requirements, the interlayer dielectric material layer 111 may also comprise suitably selected low-k dielectric materials, such as porous silicon dioxide, organic polyimides, or organosilicates such as methyl silsesquioxane (MSQ) and the like.

Figure 1B:
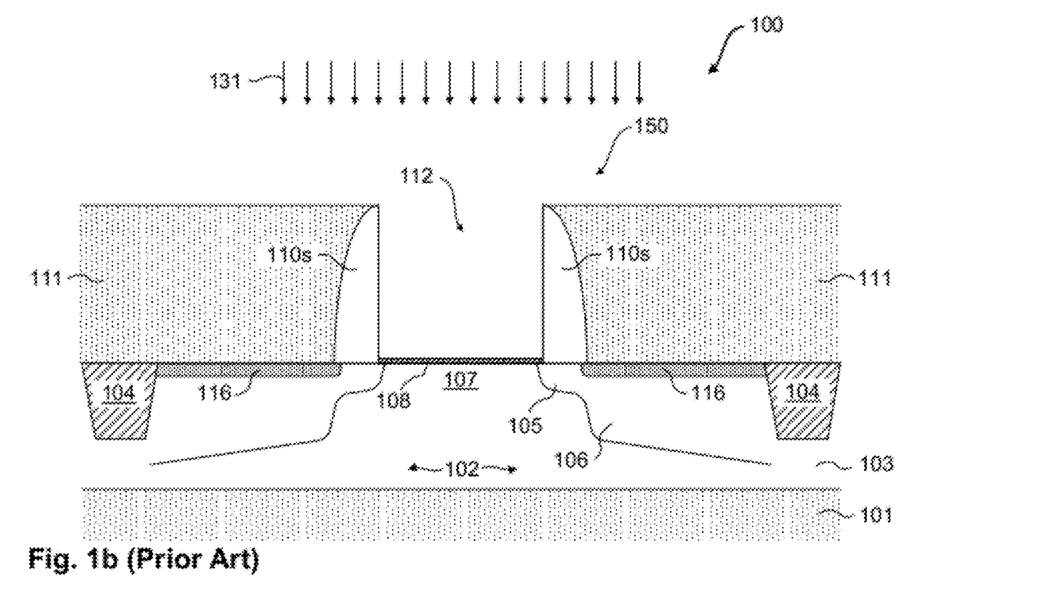

FIG. 1b shows the illustrative prior art semiconductor device 100 of FIG. 1a in a further advanced stage of manufacturing, wherein the dummy gate electrode 109 may be removed in preparation for forming a replacement metal gate electrode. As shown in FIG. 1b, an etching process 131 may be performed to form an opening 112 in the interlayer dielectric material 111. In certain embodiments, the etching process 131 may be designed to selectively remove the material of the dummy gate electrode 109 relative to the material composition of the interlayer dielectric material layer 111 and the gate insulation layer 108. For example, a dummy gate electrode 109 comprising polysilicon material may be selectively removed using any one of several suitably designed wet etch chemistries well known in the art—such as wet inorganic ammonia, tetramethylammonium hydroxide (TMAH), and the like—without inducing undue damage to the surrounding materials, including the nitride and/or oxide material comprising the interlayer dielectric material layer 111, the sidewall spacer structures 110s, the high-k dielectric material comprising the gate insulation layer 108, the ultrathin interfacial layer (not shown), or the channel region 107. Additionally, well known dry etch recipes, such as fluorine or halogen-based RIE and the like, may also be used.

Figure 1C:
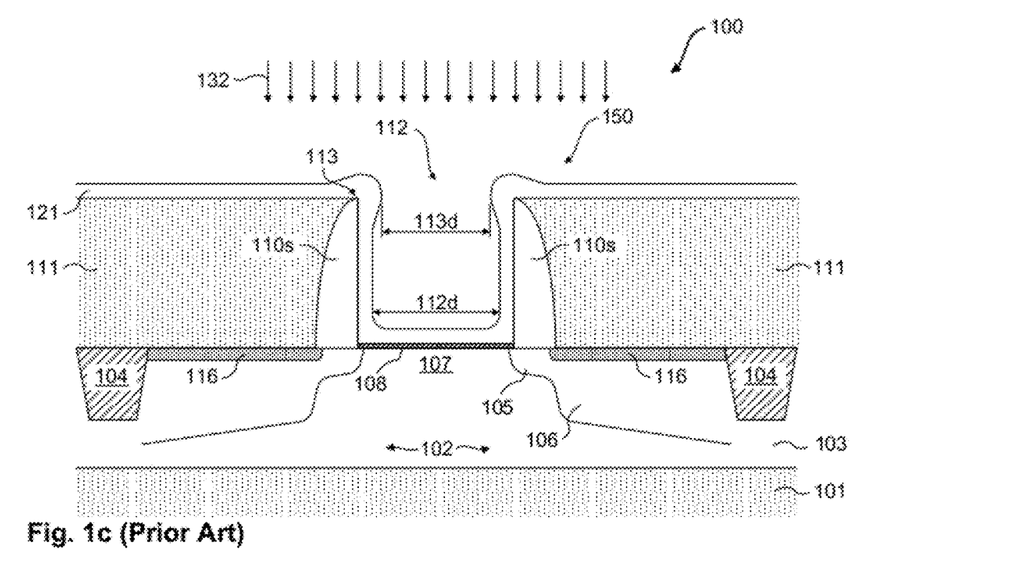
Figure 1D:
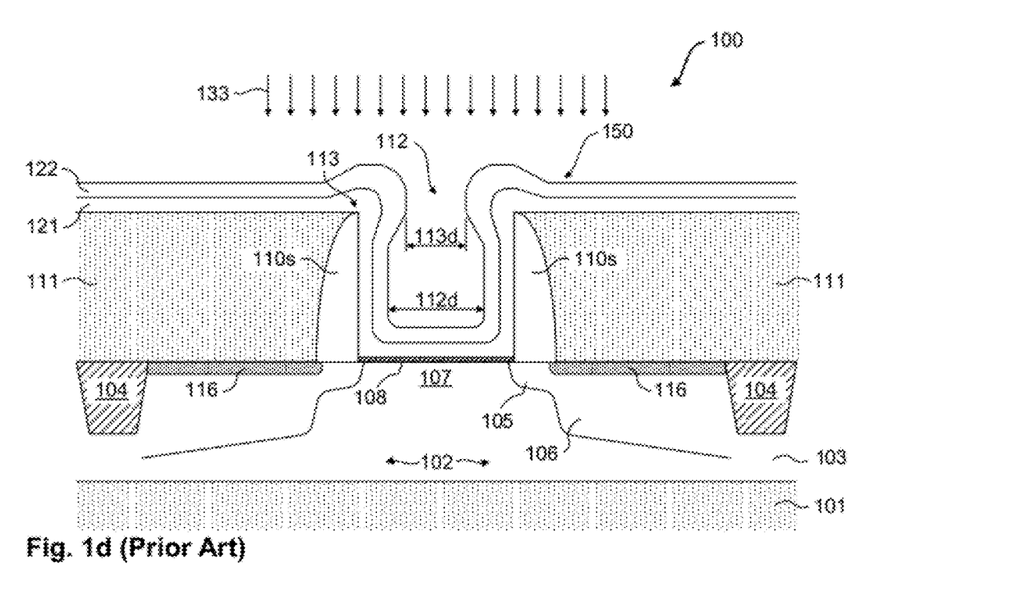
Figure 1E:
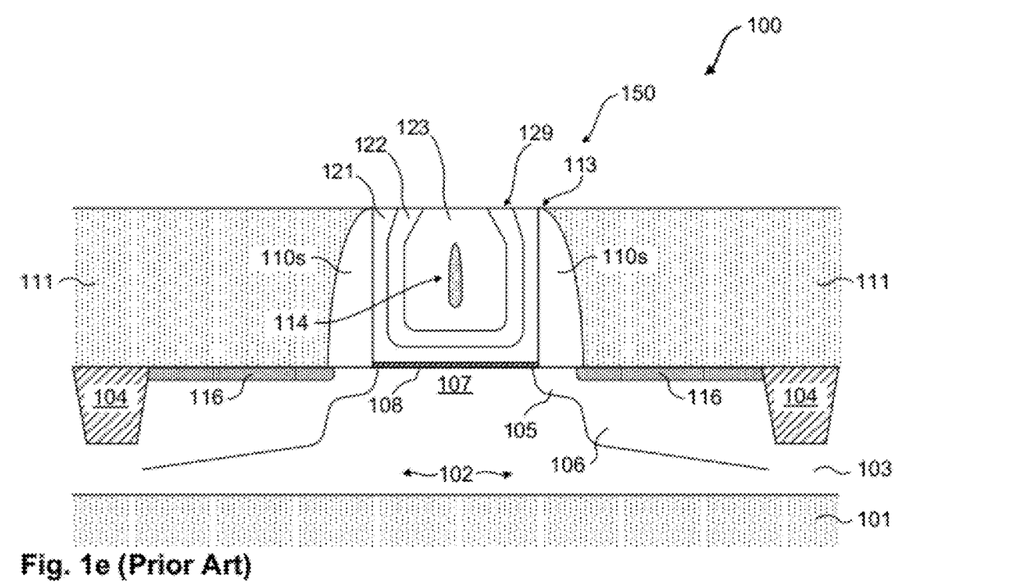

In a typical replacement metal gate (RMG) process flow, multiple layers of metal fill material may be formed in the opening 112 so as to thereby form a replacement metal gate electrode 129 (see FIG. 1e). Depending on the overall device requirements, the multiple material layers may be required so as to facilitate the proper control of the device work function, both for P-type and N-type MOS (i.e., PMOS and NMOS) transistor elements. For example, the work function of an illustrative NMOS transistor element may, in certain illustrative embodiments, require forming an N-metal in a multi-layer metal stack, which may comprise, for example, Ti, Al, TiAl, HfN, HfSi, HfSiN, and/or TaC. In some illustrative embodiments of the present disclosure, the N-metal may be remote from the high-k dielectric material gate insulation layer 108—i.e., wherein other material layers intervene therebetween—such as a high-k dielectric/TiN/N-metal/TiN/Ti/Al stack configuration. In other illustrative embodiments, the N-metal may be in direct contact with the high-k dielectric material gate insulation layer 108—i.e., a stack configuration such as high-k dielectric/N-metal/TiN/Ti/Al.

On the other hand, the work function of an illustrative PMOS transistor element may, in some embodiments, require forming a P-metal in a multi-layer metal stack, which may comprise, for example, TiN, TiON, TiOC, TiOCN, Pt, Ru, and/or Ir. In certain illustrative embodiments, the P-metal may be in direct contact with the high-k dielectric material gate insulation layer 108—i.e., a stack configuration such as high-k dielectric/P-metal/TaN/TiN/Ti/Al. In other illustrative embodiments, the P-metal may be remote from the high-k dielectric material gate insulation layer 108—i.e., with other material layers intervening therebetween—such as a high-k dielectric/TiN/TaN/P-metal/Ti/Al stack configuration. Other suitable combinations of metal gate material layers may also be used, depending on the specific type of MOS transistor and the desired work function.

FIG. 1c depicts the prior art semiconductor device 100 of FIG. 1b in an advanced manufacturing stage, wherein a first layer of metal fill material 121 of the replacement metal gate electrode 129 (see FIG. 1e) may be formed above the device 100. As shown in FIG. 1c, a first conformal deposition process 132, such as, for example, an atomic layer deposition (ALD), a chemical vapor deposition (CVD), or a physical vapor deposition (PVD) process and the like, may be performed to deposit the first layer of metal fill material 121 above the upper surface 111s of the interlayer dielectric material layer 111 and the inside of the opening 112. Depending on the overall device requirements and MOS transistor type, as well as, in some cases, the specific high-k dielectric material comprising the gate insulation layer 108, the first layer of metal fill material 121 may comprise an appropriately selected metal gate fill material such as titanium, titanium nitride, titanium oxynitride, and the like. Furthermore, as noted above, the work function of the transistor element 150 may also be affected by the thickness of the first layer of metal fill material 121, which may, in some embodiments, range from 1-2 nm.

While the ultimate goal of a conformal deposition process may generally be to form a material layer having a highly uniform thickness, some degree of deposition non-conformality may occur. More specifically, the actual as-deposited thickness of the first layer of metal fill material 121 may vary from point to point along the inside surface 112s of the opening 112, as well as along the upper surface 111s of the interlayer dielectric material layer 111, depending on the specific deposition parameters used to perform the first conformal deposition process 132. For example, as shown in FIG. 1c, the thickness of the first layer of metal fill material 121 may be somewhat increased proximate to and around the upper corner 113 of the opening 112, thereby resulting in a reduced opening size 113d of the opening 112 proximate the upper corner 113 when compared to the opening size 112d proximate the bottom 112b of the opening 112. Additionally, the degree to which the reduced opening size 113d differs from the opening size 112d may vary depending on the specific type of conformal deposition process used to form the first layer of metal fill material 121 (i.e., ALD, CVD, PVD, etc.).

FIG. 1d shows the illustrative prior art semiconductor device 100 of FIG. 1c after a second layer of metal fill material 122 has been formed above the first layer of metal fill material 121 of the device 100. For example, the second layer of metal fill material 122 may be deposited above the first layer of metal fill material 121 based on a second conformal deposition process 133, such as ALD, CVD, PVD and the like. Depending on the specific work function control parameters for the transistor element 150, the specific type of conformal deposition process used to form the second layer of metal fill material 122 may either be the same as, or different than, the type of process used to form the first layer of metal fill material 121. For example, in some embodiments, both first and second conformal deposition processes 132, 133 may be an ALD process, whereas in other embodiments, the first process 132 may be an ALD process and the second process 133 may be a CVD process or a PVD process. In yet other embodiments, the first and second conformal deposition processes 132, 133 may both be CVD process, or the first process 132 may a PVD process and the second process 133 may be an ALD process. Depending on the overall device and/or work function control requirements, other combinations of metal deposition processes may also be performed.

As noted previously, both the thickness of and the material comprising the second layer of metal fill material 122 may be adjusted so as to control the work function of the transistor element 150. Depending on the overall device requirements, the second layer of metal fill material 122 may be deposited to a thickness of 1-2 nm, and may comprise a material that is different from the material comprising the first layer of metal fill material 121. For example, as discussed previously, in illustrative embodiments of the present disclosure wherein the first layer of metal fill material 121 comprises titanium nitride (TiN), the second layer of metal fill material 122 of an NMOS transistor may comprise titanium aluminum (TiAl), whereas the second layer of metal fill material 122 of a PMOS transistor may comprise tantalum nitride (TaN). Other material combinations may also be used, depending on the desired work function and overall device requirements.

As with the first layer of metal fill material 121, the second layer of metal fill material 122 may also exhibit, to some degree, an amount of deposition non-conformality proximate the upper corner 113 of the opening 112, as illustrated in FIG. 1d. That is, the thickness of the second layer of metal fill material 122 may, in some cases, be greater proximate the upper corner 113 of the opening 112 than proximate the bottom 112b of the opening 112, thereby further reducing the opening size 113d when compared to the opening size 112d.

FIG. 1e shows the prior art semiconductor device 100 of FIG. 1d during a further manufacturing stage, wherein the replacement metal gate electrode 129 has been substantially completed. As shown in FIG. 1e, a third layer of metal fill material 123 may be formed above the second layer of metal fill material 122 of the semiconductor device 100 so as to fill the remaining space inside of the opening 112. In some embodiments, the third layer of metal fill material 123 may be formed above the second layer of metal fill material 122 using one of several suitably designed conformal deposition processes, such as ALD, CVD, PVD, and the like. Furthermore, depending on the device requirements and the desired work function of the transistor element 150, the material comprising the third layer of metal fill material 123 may comprise a suitable metal gate material, such as, for example, titanium nitride (TiN), hafnium nitride (HfN), hafnium silicide (HfSi), titanium oxynitride (TiON) and the like. Thereafter, a planarization process (not shown) may be performed to remove excess material of the first, second and third layers of metal fill material 121, 122, 123 that may have been formed above the upper surface of the interlayer dielectric material layer 111, thereby forming the replacement metal gate electrode 129 in the opening 112. Depending on the desired process strategy, as well as the materials comprising the first, second and third layers of metal fill material 121, 122, 123, the planarization process may comprise, for example, a chemical mechanical polishing (CMP) process, or a suitably designed wet or dry selective etch process, recipes for which are well known in the art.

Depending on the deposition parameters employed during the conformal deposition process used to form the third layer of metal fill material 123, the increased thickness of the second layer of metal fill material 122 proximate the upper corner 113 of the opening 112 and the commensurately reduced opening size 113d (see FIG. 1d) may prevent the third layer of metal fill material 123 from completely filling the opening 112, thereby leaving an unfilled void space 114 in the replacement metal gate electrode 129, as shown in FIG. 1e. The problem of incomplete filling of the opening 112 is of particular importance in later generation technology nodes, as the gate lengths of transistor elements—and the opening sizes available in the RMG processes—continue to shrink. For example, in the 22/20 technology node, where the gate length and/or opening size may be on the order of 25-28 nm or even less, a conformally deposited first layer of metal fill material 121 having a nominal thickness of 1-2 nm may result in a reduced opening size 113d proximate the upper corner of the opening of approximately 12-15 nm. This leaves a significantly reduced opening size through which to form the second and succeeding layers of metal fill material, thereby leading to a reduced ability to control the transistor's work function, and an associated reduction in overall device reliability and product yield.

Accordingly, there is a need to implement new design strategies to address the manufacturing and performance issues associated with the typical replacement metal process flows utilizing multilayer metal fill regimes for aggressively scaled transistor elements. The present disclosure relates to methods and devices for avoiding or at least reducing the effects of one or more of the problems identified above.

SUMMARY OF THE DISCLOSURE

The following presents a simplified summary of the present disclosure in order to provide a basic understanding of some aspects disclosed herein. This summary is not an exhaustive overview of the disclosure, nor is it intended to identify key or critical elements of the subject matter disclosed here. Its sole purpose is to present some concepts in a simplified form as a prelude to the more detailed description that is discussed later.

Generally, the subject matter disclosed herein relates to modern sophisticated semiconductor devices and methods for forming the same, wherein a multilayer metal fill may be used to fill narrow openings formed in an interlayer dielectric layer. One illustrative method disclosed herein includes forming an opening in a dielectric material layer of a semiconductor device formed above a semiconductor substrate, the opening having sidewalls and a bottom surface. The method also includes forming a first layer of first fill material above the semiconductor device by forming the first layer inside the opening and at least above the sidewalls and the bottom surface of the opening. Furthermore, the method includes performing a first angled etching process to at least partially remove the first layer of first fill material from above the semiconductor device by at least partially removing a first portion of the first layer proximate an inlet of the opening without removing a second portion of the first layer proximate the bottom of said opening, and forming a second layer of second fill material above the semiconductor device by forming the second layer inside the opening and above the first layer.

Also disclosed herein is a method for forming a multilayer replacement metal gate electrode of a semiconductor device that includes, among other things, removing a dummy gate electrode from above a semiconductor substrate to form an opening in a dielectric layer of the semiconductor device. The method further includes forming a plurality of metal fill material layers in the opening, wherein one or more of the plurality of metal fill material layers comprises vertical portions formed above sidewalls of the opening and a horizontal portion formed above a bottom surface of the opening. Also included in the method is the step of performing an angled ion beam etching process after forming each of the plurality of metal fill material layers except the last of those layers, which includes removing at least a portion of each of the plurality of metal fill material layers proximate an inlet of the opening without removing a portion of each of the plurality of metal fill material layers proximate the bottom surface of said opening. Finally, the disclosed illustrative method includes performing a planarization process after forming the last of the plurality of metal fill material layers.

Yet another illustrative embodiment disclosed herein includes a method for using a semiconductor processing tool to form a multilayer metal fill in an opening of a semiconductor device, which includes positioning a semiconductor wafer comprising the semiconductor device in one of a plurality of deposition chambers of the semiconductor processing tool, and depositing a first metal material layer above the semiconductor device in one of the plurality of deposition chambers. Furthermore, the method includes positioning the semiconductor wafer in an ion beam etching chamber of said semiconductor processing tool, wherein the ion beam etching chamber is adapted to perform an angled etching process, and performing an angled ion beam etching process to remove at least a portion of the first metal material layer. Finally, the disclosed method includes positioning the semiconductor wafer in a second one of the plurality of deposition chambers, and depositing a second metal material layer above the semiconductor device using in the second one of the plurality of deposition chambers.

An illustrative semiconductor device is also disclosed herein, which includes a conductive metal structure having a first end and a second end opposite of the first end. The conductive metal structure comprises a plurality of metal fill material layers extending at least from the first end to the second end, wherein a thickness of at least one of the plurality of metal fill material layers at the first end is greater than a thickness of the at least one metal fill material layer at the second end.

BRIEF DESCRIPTION OF THE DRAWINGS

The disclosure may be understood by reference to the following description taken in conjunction with the accompanying drawings, in which like reference numerals identify like elements, and in which.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the present subject matter are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Generally, the subject matter disclosed herein provides manufacturing techniques and semiconductor devices in which an opening formed in an interlayer dielectric material, such as a gate electrode trench and the like, may have a critical dimension—i.e., a least dimension—of 30 nm or even less. For example, the critical dimension of a gate electrode structure may usually be understood by one of ordinary skill in the art to be the gate length, or the length of the gate dielectric material layer formed above the channel region of a transistor element, and between the source and drain regions of the transistor. In sophisticated modern semiconductor devices based on a 22/20 nm technology node, the critical dimension, or gate length, may be on the order of 25-28 nm. Accordingly, when a replacement metal gate process flow is used to form HK/MG gate electrode stacks based on 22/20 nm design technology, the least dimension across an opening formed in an interlayer dielectric material layer may be approximately 25-28 nm. Furthermore, when the device technology is based on even further reduced gate electrode sizes, such as, for example, a 16/14 nm technology node, the critical dimension of an opening size necessary for the replacement metal gate process flow may be even smaller, such as approximately 15-20 nm, or even less.

Furthermore, the techniques described herein may also be useful when using a multilayer metal fill process to fill via openings so as to thereby form conductive contacts elements to the various contact regions of semiconductor devices. Depending on the specific device requirements, a via opening used to form a conductive contact element may one of several different shapes, such as, for example, circular, square, rectangular, and the like. As with the gate electrode structures described above, the critical dimension of a typical via opening, irrespective of the via shape, may generally be considered by one of ordinary skill in the art to be the least dimension across the opening. Moreover, in some applications, the aspect ratio of typical via openings may be even greater than that of an opening formed in conjunction with the replacement metal gate process flow, as previously described. In such cases, the problems associated with multilayer metal fill processes as previously described may be compounded, thereby further contributing to the benefits of the methods described herein.

It should be noted that, where appropriate, the reference numbers used in describing the various elements shown in the illustrative embodiments of FIGS. 2a-2g and FIGS. 3a-3b substantially correspond to the reference numbers used in describing the corresponding elements illustrated in FIGS. 1a-1e above, except that the leading numeral for has been changed from a "1" to a "2," or to a "3." For example, transistor element "100" corresponds to transistor elements "200" and/or "300," gate insulation layer "108" corresponds to gate insulation layers "208" and/or "308," and so on. Accordingly, the reference number designations used to identify some elements of the presently disclosed subject matter may be illustrated in the FIGS. 2a-2g and FIGS. 3a-3b, but may not be specifically described in the following disclosure. In those instances, it should be understood that the numbered elements shown in FIGS. 2a-2g and FIGS. 3a-3b which are not described in detail below substantially correspond with their like-numbered counterparts illustrated in FIGS. 1a-1e, and described in the associated disclosure set forth above.

Figure 2A:
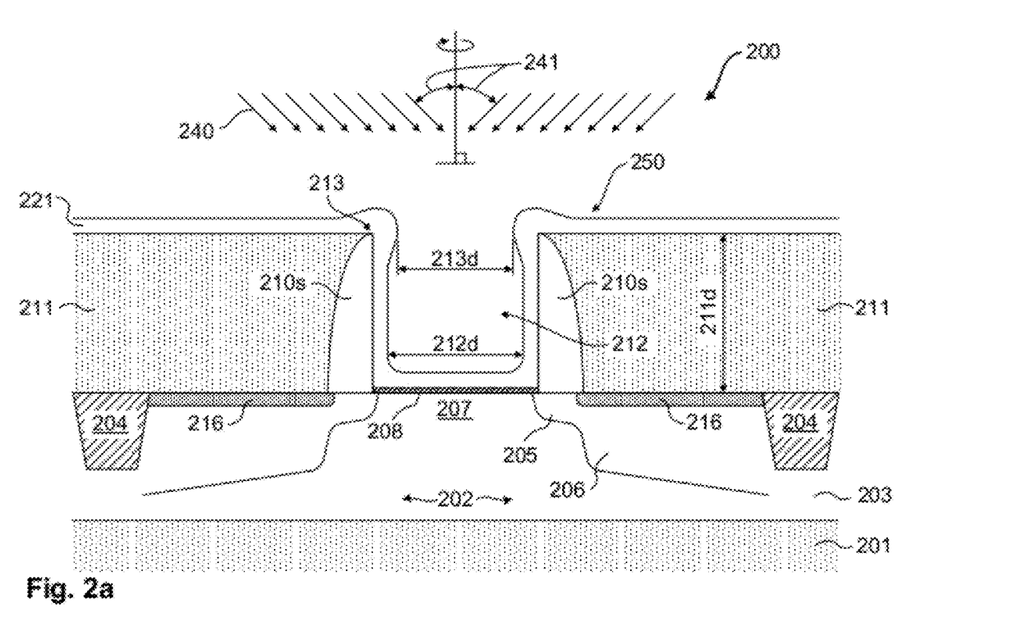
FIGS. 2a-2g schematically illustrate a process flow of an illustrative embodiment of the subject matter disclosed herein.

FIG. 2a shows a schematic cross-sectional view of an illustrative semiconductor device 200 of the present disclosure that substantially corresponds to the semiconductor device 100 illustrated in FIG. 1c, wherein a first layer of metal fill material 221 has been formed above the semiconductor device 200—i.e., above the upper surface 211s of the interlayer dielectric material layer 211 and above the inside surfaces 212s of the opening 212. As used in the present disclosure, the phrase "above the inside surfaces 212s" may include a substantially horizontal portion formed above the bottom surface of the opening 212, as well as substantially vertical portions formed above—i.e., proximate or adjacent to—each of the sidewalls of the opening 212. Depending on the desired process sequence and overall device requirements, the first layer of metal fill material 221 may be formed directly on the inside surfaces 212s of the opening 212, whereas in some embodiments, intervening material layers, such as liner layers, barrier layers, seed layers, and the like, may be formed between the first layer 221 and the inside surfaces 212. Therefore, as used in the present disclosure, first layer of metal fill material 221 formed "above the semiconductor device 200" may include portions that are formed directly on the inside surfaces 212s of the opening 212, portions with intervening layers therebetween, or some combination thereof.

In the embodiment illustrated in FIG. 2a, the first layer of metal fill material 221 may have an increased thickness proximate to and around the upper corner 213 of the opening 212, resulting in a reduced opening size 213d of the opening 212 proximate the upper corner 213 relative to the opening size 212d proximate the bottom 212b of the opening 212. The illustrative semiconductor device 200 shown in FIG. 2a may be formed as previously described above with respect to the semiconductor device 100 of FIGS. 1a-1c. Furthermore, in the manufacturing stage depicted in FIG. 2a, the semiconductor device 200 may, in some illustrative embodiments, be exposed to a first angled ion beam etching process 240 adapted to remove at least a portion of the first layer of metal fill material 221 from above the semiconductor device 200.

Depending on the thickness and material composition of the first layer of metal fill material 221, the first angled ion beam etching process 240 may be performed based on an etch angle 241 that ranges between 45° and 89° relative to a vertical axis of the opening 212, or to a vector that is substantially perpendicular to the semiconductor substrate 201. Furthermore, the etch angle 241 may be adjusted within this range so that the lower sidewalls 212L and bottom surface 212b of the opening 212 may be substantially shielded from the effects of the first angled ion beam etching process 240. In this way, a portion of the first layer of metal fill material 221 may be removed from the upper sidewalls 212u of the opening 212—i.e., that portion of the first layer 221 having an increased thickness proximate the upper corner 213—whereas removal of those portions of the first layer 221 from the lower sidewalls 212L and bottom surface 212b of the opening 212 may be substantially avoided.

Additionally, other etching parameters of the first angled ion beam etching process 240 may also be adjusted so as to facilitate the selective removal of portions of the first layer of metal fill material 221 as described above. For example, the first angled ion beam etching process 240 may be performed, in some illustrative embodiments, in the range of approximately 100-400 volts (DC) at an argon (Ar) pressure of approximately $1 \times 10^{-4}$ torr for a duration of approximately 15-500 seconds, whereas in specific embodiments, the etching process may be performed for a duration that ranges from 60-200 seconds. Furthermore, the etch angle 241, voltage, and duration of the first angled ion beam etching process 240 may be adjusted as required so as to remove substantially all of the portion of the first layer of metal fill material 221 from the upper surface 211s of the interlayer dielectric material layer 211 while minimizing any overetching effects on the interlayer dielectric material layer 211. That is, in some illustrative embodiments, the amount of material removed from the upper surface 211s of the interlayer dielectric material layer 211 may be limited to about 1-2 nm by adjusting the aforementioned ion beam etching parameters. For example, in certain illustrative embodiments, the first angled ion beam etching process 240 may be performed at an etch angle 241 of 70°-80° using a DC voltage between 300-400 volts for a period of approximately 60-80 seconds.

Figure 2B:
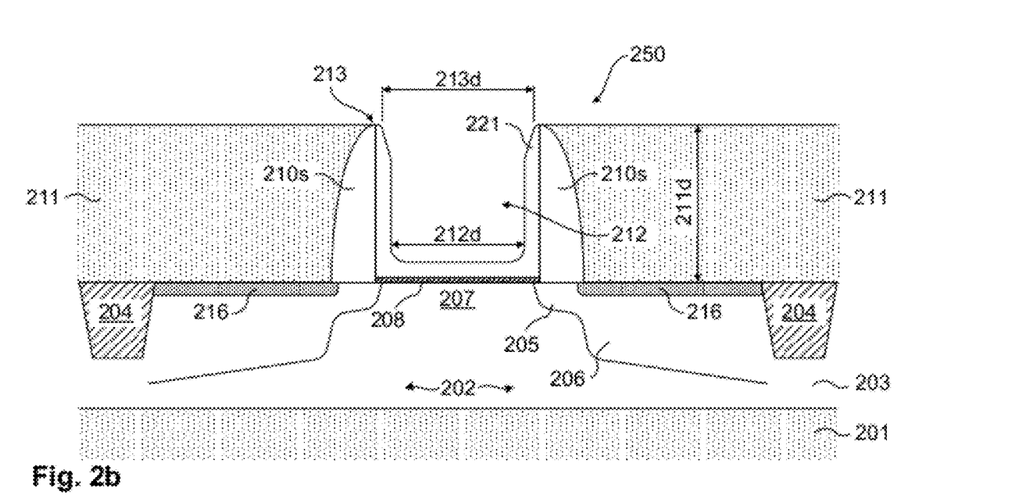
Figure 2C:
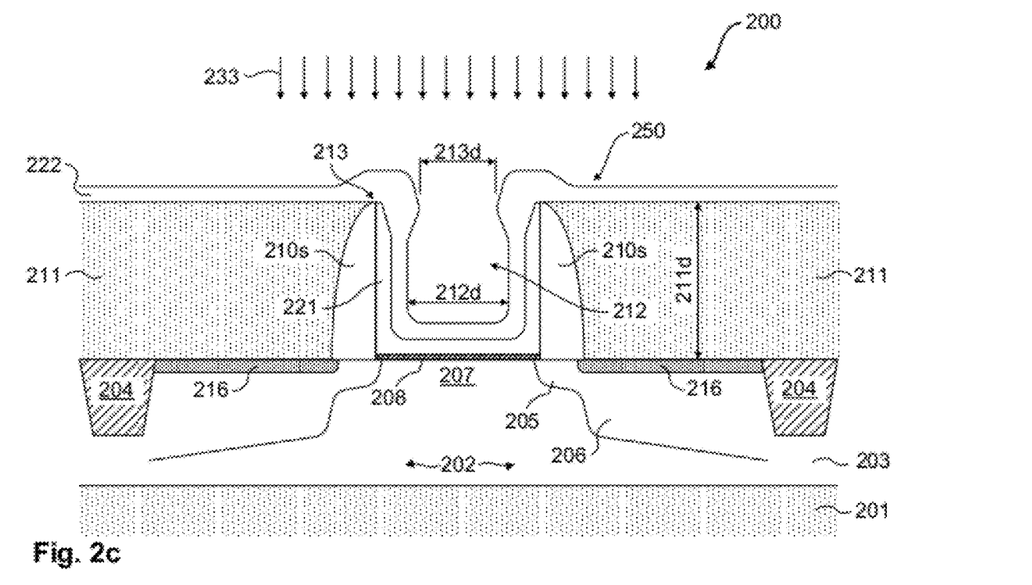
Figure 2D:
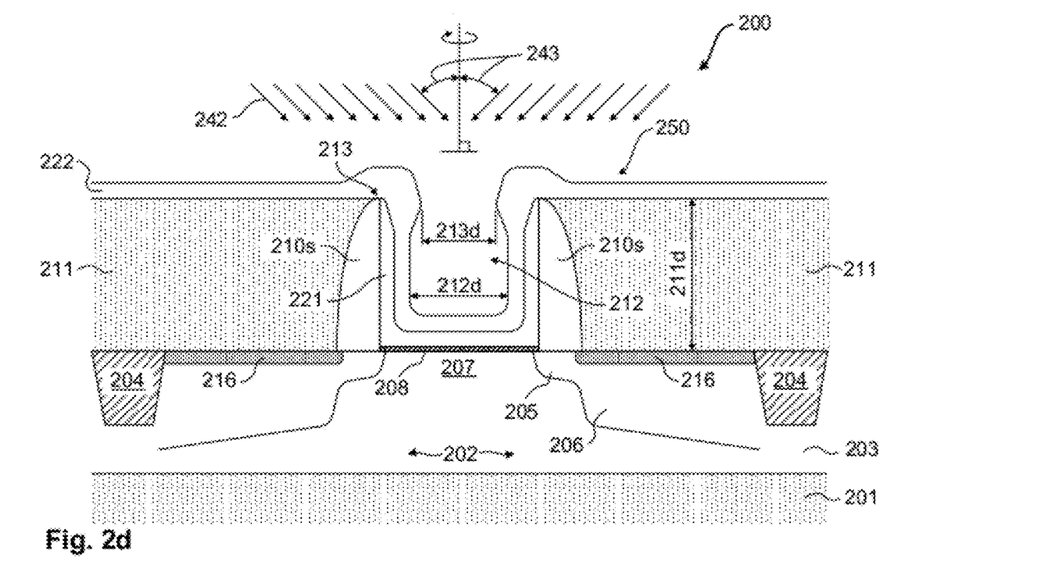
Figure 2E:
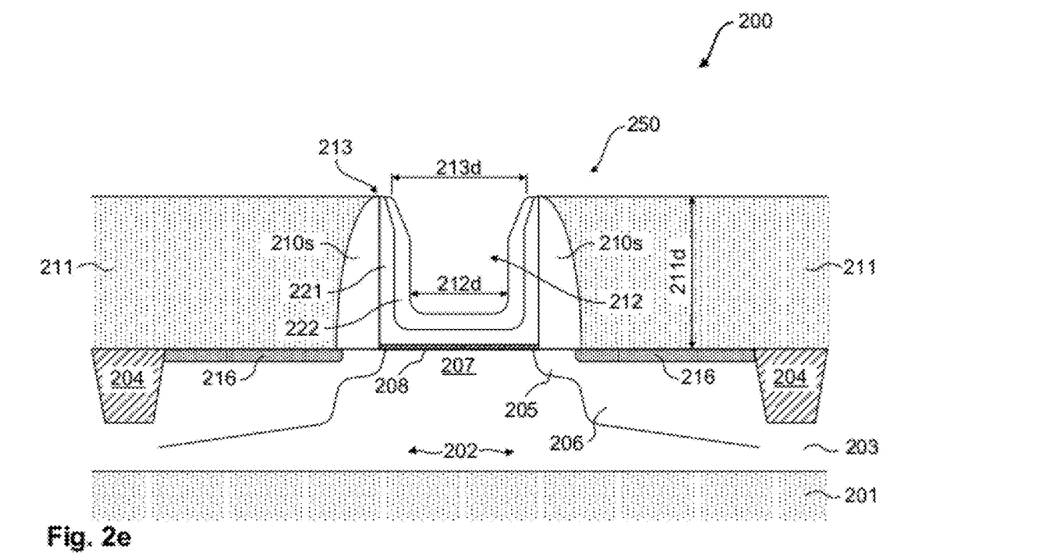
Figure 2F:
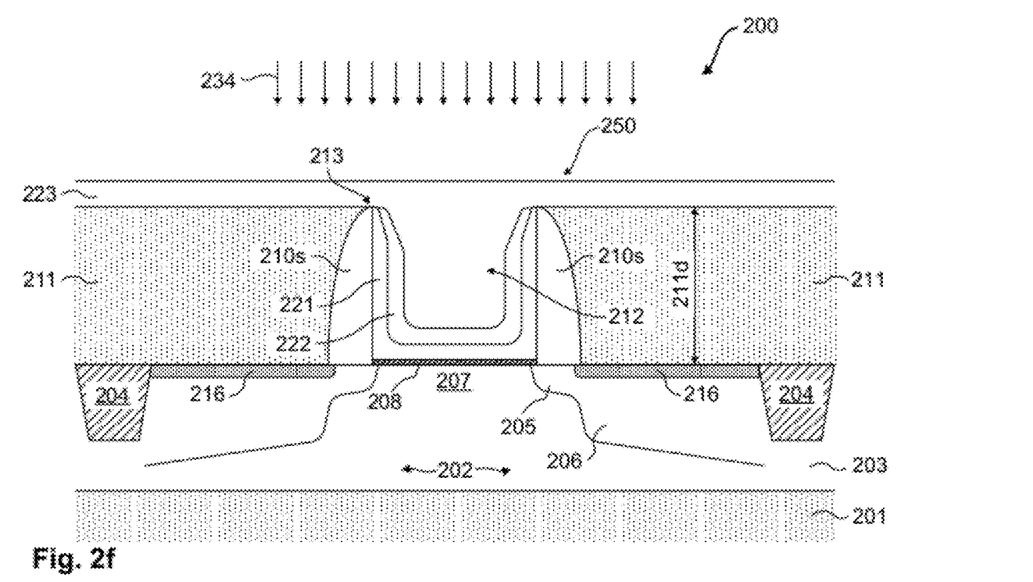
Figure 2G:
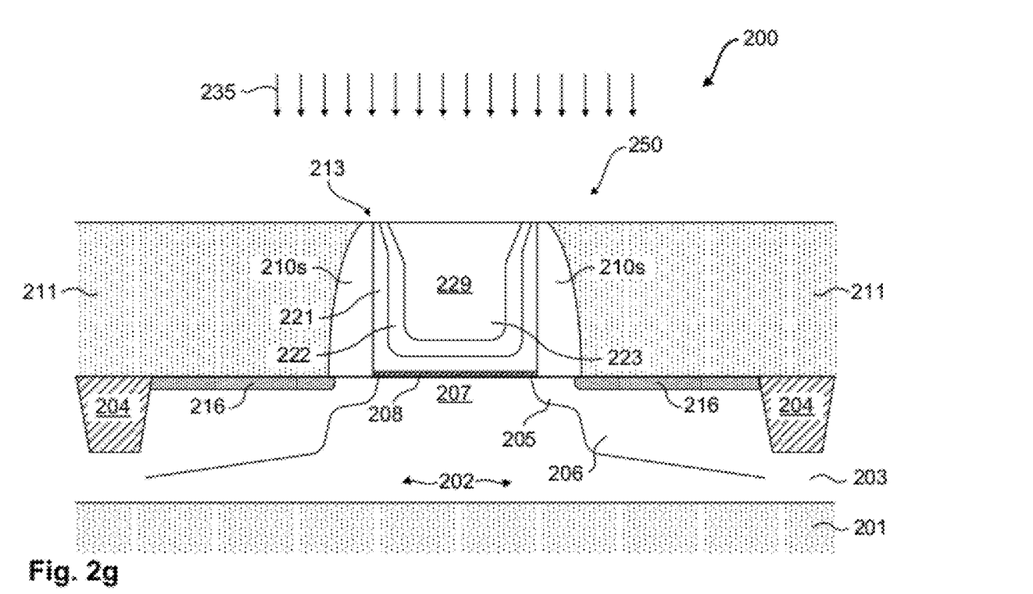

It should be noted, however, that the thickness 211d of the interlayer dielectric material layer 211 may be adjusted as necessary so as to account for any amount of overetching that may occur as a result of the first angled ion beam etching process 240, thereby providing the requisite final thickness of the interlayer dielectric material layer 211, and the corresponding requisite final height 229h of the replacement gate electrode 229 (see FIG. 2g). Furthermore, the thickness 211d of the interlayer dielectric material layer 211 may also be adjusted to account for any additional angled ion beam etching processes that may be performed throughout the subsequent processing of the semiconductor device 200, as will be discussed in further detail below.

FIG. 2b illustrates one embodiment of the semiconductor device 200, after the first angled ion beam etching process 240 has been performed, and a portion of the first layer of metal fill material 221 has been removed from above the device 200. As shown in FIG. 2b, the first layer of metal fill material 221 may be substantially removed from the upper surface 211s of the interlayer dielectric material layer 211. Furthermore, in some embodiments of the present disclosure, a portion of the first layer of metal fill material 221 may also be substantially removed from the upper sidewalls 212u of the opening 212. More specifically, that portion of the first layer of metal fill material 221 having an increased thickness around the upper corner 213 of the opening 212 may be substantially removed during the first angled ion beam etching process 240, thereby increasing the opening size 213d proximate the upper corner 213. On the other hand, those portions of the first layer of metal fill material 211 on the lower sidewalls 212L and bottom surface 212b of the opening 212—which may have been substantially shielded from the effects of the first angled ion beam etching process 240—may remain substantially in place. Furthermore, it should be noted that the semiconductor device 200 may be continuously rotated about an axis that is substantially perpendicular to the plane of the semiconductor substrate 201 throughout the duration of the first angled ion beam etching process 240, thereby ensuring that material removal from the upper sidewalls 212u of the opening 212 proximate the upper corner 213 may be substantially uniform along all sides of the opening 212.

Depending on the specific etching parameters used for the first angled ion beam etching process 240, such as etch angle 241, voltage, duration, and the like, removal of the portion of the first layer of metal fill material 221 having an increased thickness around the upper corner 213 of the opening 212 may, in certain illustrative embodiments, result in an increased opening size 213d proximate the upper corner 213 relative to the opening size 212d proximate the bottom 212b of the opening 212. Moreover, the increased opening size 213d may facilitate the formation of additional layers of metal fill material in the opening 212 and thereby reduce the likelihood that a void space may be trapped in the finished replacement metal gate electrode, as will be discussed in additional detail below.

FIG. 2c shows the illustrative semiconductor device 200 of FIG. 2b in a further advanced manufacturing stage, wherein a second layer of metal fill material 222 may be formed above the semiconductor device 200—i.e., above the upper surface 211s of the interlayer dielectric material layer 211 and above the portions of the first layer of metal fill material 221 remaining inside of the opening 212. As illustrated in FIG. 2c, the second layer of fill material 222 formed inside of the opening 212 may include a substantially horizontal portion formed above the first layer of metal fill material 221 at the bottom of the opening 212, as well as substantially vertical portions formed above—i.e., proximate or adjacent to—remaining portions of the first layer 221 above each of the sidewalls of the opening 212. Depending of the desired process flow and specific device requirements, the second layer of metal fill material 222 may be formed directly on the first layer of metal fill material 221, whereas in some embodiments, intervening material layers may be present between the second layer 222 and first layer 221. Therefore, as used in the present disclosure, the second layer of metal fill material 222 formed "above the semiconductor device 200" may include portions that are formed directly on the first layer of metal fill material 221, portions with intervening layers therebetween, or some combination thereof.

As shown in FIG. 2c, a second conformal deposition process 233, such as ALD, CVD, PVD and the like, may be performed to deposit the second layer of metal fill material 222 having a substantially uniform thickness. Depending on the device requirements, as well as work function control considerations, the second layer of metal fill material may comprise any suitable metal gate electrode material, such as titanium aluminum, titanium nitride, hafnium nitride, tantalum nitride and the like. However, as discussed previously, the second layer of metal fill material 222 may also exhibit some degree of deposition non-conformality proximate to and around the upper corner 213 of the opening 212, which, in some embodiments, may again result in a reduced opening size 213d proximate the upper corner 212 when compared to the opening size 212d proximate the bottom 212b of the opening 212.

FIG. 2d shows the illustrative semiconductor device 200 of FIG. 2c in a further advanced manufacturing stage, wherein a second angled ion beam etching process 242 may be performed so as to remove at least a portion of the second layer of metal fill material 222 from above the semiconductor device 200. As with the first angled ion beam etching process 240 discussed previously, the semiconductor device 200 may be continuously rotated throughout the duration of the second angled ion beam etching process 242. Furthermore, and depending on the thickness and material composition of the second layer of metal fill material 222, the second angled ion beam etching process 242 may be performed based on an etch angle 243 of approximately 45°-89° relative to a vertical axis of the opening 212, or to a vector that is substantially perpendicular to the semiconductor substrate 201. Moreover, as previously discussed with respect to the first angled ion beam etching process 240, the etch angle 243 may be also adjusted within this range so that the lower sidewalls 212L and bottom surface 212b of the opening 212 may be substantially shielded from the effects of the second angled ion beam etching process 242. As such, a portion of the second layer of metal fill material 222 may be removed from the upper sidewalls 212u of the opening 212, and removal of layer portions from the lower sidewalls 212L and bottom surface 212b of the opening 212 may be avoided.

In some illustrative embodiments, the second ion beam etching process 242 may also be performed based on a voltage of approximately 100-400 volts (DC), an argon (Ar) pressure of approximately $1 \times 10^{-4}$ torr, and a duration in the range of 60-200 seconds. Furthermore, the etch angle 243, voltage, and duration of the second angled ion beam etching process 242 may be adjusted as required so as to substantially remove the portion of the second layer of metal fill material 222 from the upper surface 211s of the interlayer dielectric material layer 211 while minimizing any overetching of the interlayer dielectric material layer 211. That is, as with the first angled ion beam etching process 240, the amount of interlayer dielectric material removed from the upper surface 211s of the interlayer dielectric material layer 211 may be limited to approximately 1-2 nm by adjusting the specific ion beam etching parameters. Furthermore, the thickness 211d of the interlayer dielectric material layer 211 may be adjusted when first deposited so as to account for any overetching that may occur during the second angled ion beam etching process 242, thereby ensuring that the final height 229h of the replacement gate electrode 229 (see FIG. 2g) meets overall device design requirements.

FIG. 2e depicts the semiconductor device 200 of FIG. 2d in a further advanced stage of manufacturing, after the second angled ion beam etching process 242 has been completed, and a portion of the second layer of metal fill material 222 has been removed from above the semiconductor device 200. As shown in FIG. 2e, the second layer of metal fill material 222 may, in certain illustrative embodiments, be completely removed from the upper surface 211s of the interlayer dielectric material layer 211, and wherein, in some illustrative embodiments, a portion of the second layer of metal fill material 222 may also be substantially removed from the upper sidewalls 212u of the opening 212, proximate the upper corner 213. Specifically, in certain embodiments of the present disclosure, the portion of the second layer of metal fill material 222 having an increased thickness proximate the upper corner 213 of the opening 212 may be substantially removed during the second angled ion beam etching process 240, thereby once again increasing the opening size 213d proximate the upper corner 213. Depending on the specific etching parameters used for the second angled ion beam etching process 242, such as etch angle 243, voltage, duration, and the like, removal of the portion of the second layer of metal fill material 22 having an increased thickness around the upper corner 213 of the opening 212 may, in some illustrative embodiments, result in an increased opening size 213d proximate the upper corner 213 relative to the opening size 212d proximate the bottom 212b of the opening 212, thereby facilitating easier deposition of any subsequent layers of metal fill material in the opening 212.

FIG. 2f shows the semiconductor device 200 in yet a further illustrative manufacturing stage, wherein a third layer of metal fill material 223 is formed above the semiconductor device 200, i.e., above the upper surface 211s of the interlayer dielectric material layer 211, and above and/or proximate to the remaining portions of the first and second layers of metal fill material 221, 222 inside of the opening 212. As shown in FIG. 2f, in some illustrative embodiments a third deposition process 234 may be performed to deposit the third layer of metal fill material above the semiconductor device 200 so as to completely fill the opening 212, which may also include, in certain embodiments, an additional portion 223e above the upper surface 211s of the interlayer dielectric material layer 211. Depending on device requirements and/or work function control considerations, the third deposition process 234 may comprise any suitable deposition process that may provide complete, void-free filling of the opening 212, such as, for example, an ALD process, a CVD process, a PVD process, and the like. Furthermore, as with the previously deposited layers of metal fill material 221, 222, the third layer of metal fill material 223 may comprise a metal gate electrode material that satisfies the work function control requirements of the specific transistor element 250, such as titanium nitride, titanium aluminum nitride, titanium silicon nitride, and the like.

FIG. 2g shows the illustrative semiconductor device of FIG. 2f in yet a further advanced manufacturing stage, after completion of a planarization process 235. As shown in FIG. 2g, the additional portion 223e of the third layer of metal fill material 223 formed above the upper surface 211s of the interlayer dielectric material layer 211 may be completely removed by an appropriately designed planarization process 235, such as a CMP process, an etch process, and the like. As a result, a replacement metal gate electrode 229 may be formed in the opening 212 without trapping an unfilled void space, such as the void space 114 shown in FIG. 1e, thereby avoiding the type of defects that may lead to decreased device reliability and/or reduced product yield.

It will be appreciated that, while FIGS. 2a-2g and the associated description set forth above may be directed to a replacement gate electrode process flow based on a multilayer metal fill technique comprising three layers of metal fill material, the disclosed techniques may be readily applicable to any number of metal fill material layers, including two, three, four, five, or even more, depending on the overall device requirements and/or work function control considerations. Moreover, the techniques described above may also be utilized in any number of semiconductor processing flows, wherein device parameters may require that a multilayer fill material be used to fill an opening formed in a material layer of a semiconductor device. For example, the conformal layer deposition/angled ion beam etching process sequence described above may be used to fill contact via openings, deep trench openings, and the like, wherein the formation of trapped void spaces may be problematic.

Figure 3A:
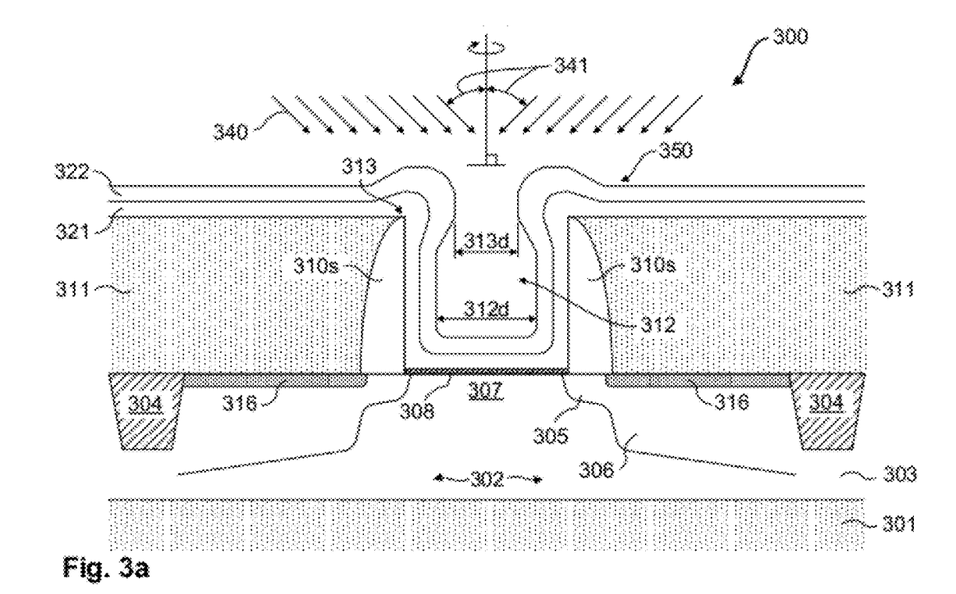
FIGS. 3a-3b schematically illustrate a process flow of yet another illustrative embodiment of the presently disclosed subject matter.
Figure 3B:
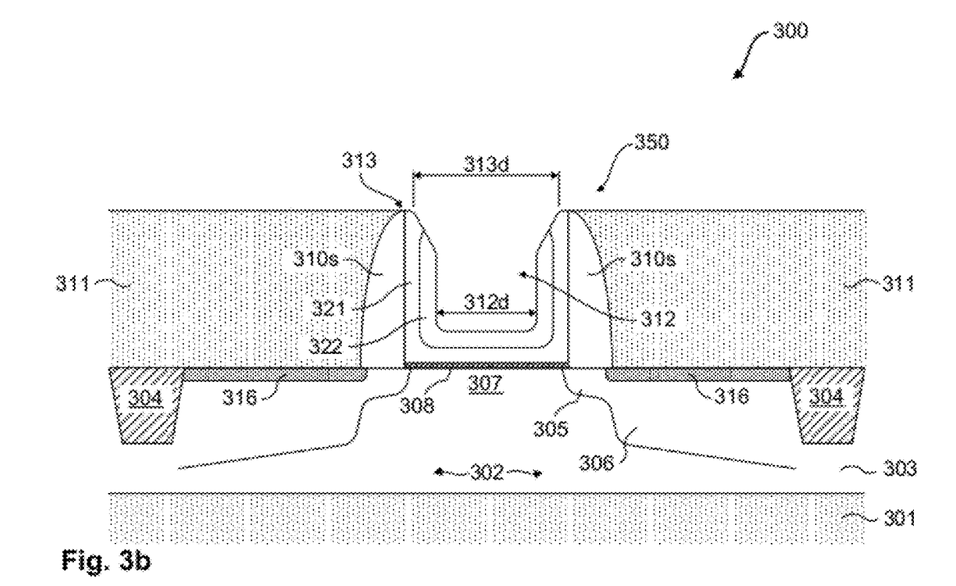

A further illustrative embodiment of the present disclosure as depicted in FIGS. 3a-3b, wherein the above-described angled ion beam etching processes may not be performed after the deposition of each individual layer of metal fill material, will now be described.

FIG. 3a shows a schematic cross-sectional view of an illustrative semiconductor device 300 of the present disclosure that substantially corresponds to the semiconductor device 100 illustrated in FIG. 1d and described above, wherein first and second layers of metal fill material 321, 322 may be formed above the semiconductor device 300. In the embodiment illustrated in FIG. 3a, the first and second layers of metal fill material 321, 322 may each have an increased thickness proximate to and around the upper corner 313 of the opening 312, which may result in a significantly reduced opening size 313d of the opening 312 proximate the upper corner 313 relative to the opening size 312d proximate the bottom 312b of the opening 312. The semiconductor device 300 shown in FIG. 3a may be formed as previously described above with respect to the semiconductor device 100 of FIGS. 1a-1d.

In the manufacturing stage depicted in FIG. 3a, the semiconductor device 300 may, in some illustrative embodiments, be exposed to an angled ion beam etching process 340 adapted to remove at least a portion of each of the first and second layers of metal fill material 321, 322 from above the semiconductor device 300. As with the angled ion beam etching processes discussed previously with respect to FIGS. 2a-2d and semiconductor device 200, the semiconductor device 300 may be continuously rotated throughout the duration of the angled ion beam etching process 340. Furthermore, and depending on the thickness and material composition of the first and second layers of metal fill material 321, 322, the etch angle 243, voltage, and duration of the angled ion beam etching process 340 may be adjusted within the previously discussed ranges as required to completely remove portions of the first and second layers of metal fill material 321, 322 from the upper surface 311s of the interlayer dielectric material layer 311, while the lower sidewalls 312L and bottom surface 312b of the opening 312 may be shielded from the effects of the angled ion beam etching process 340. More specifically, the thicker, multilayer metal fill may require a higher energy level, a steeper etching angle, and a longer etching duration to ensure that material removal objective are met. For example, in certain illustrative embodiments, the parameters used to perform the angled ion beam etching process 340 may include an etch angle 241 of 65°-75°, a DC voltage between 300-400 volts, and an etching period of approximately 100-110 seconds or more.

As with the first and second angled ion beam etching processes 240, 242 discussed with respect to FIGS. 2a and 2d above, in certain illustrative embodiment of the present disclosure it may be desirable to minimize any overetching effects of the interlayer dielectric material layer 311. That is, the amount of interlayer dielectric material removed from the upper surface 311s of the interlayer dielectric material layer 311 may be limited to approximately 1-2 nm by adjusting the specific parameters of the angled ion beam etching process 340. Furthermore, the thickness of the interlayer dielectric material layer 311 may be adjusted when initially deposited so as to account for any overetching that may occur, thereby ensuring that the final height of a finished replacement gate electrode meets overall device design requirements.

FIG. 3b depicts the semiconductor device 300 of FIG. 3a in a further advanced stage of manufacturing, after the angled ion beam etching process 340 has been completed, and portions of the first and second layers of metal fill material 321, 322 have been removed from above the semiconductor device 300. As shown in FIG. 3b, the first and second layers of metal fill material 321, 322 may, in certain embodiment, be completely removed from the upper surface 311s of the interlayer dielectric material layer 311, and wherein, in some illustrative embodiments, portions of the first and second layers of metal fill material 321, 322 may also be substantially removed from the upper sidewalls 312u of the opening 312, proximate the upper corner 313. Specifically, in certain embodiments of the present disclosure, the portions of the first and second layers of metal fill material 321, 322 having an increased thickness proximate the upper corner 313 may be substantially removed during the angled ion beam etching process 340, thereby increasing the opening size 313d proximate the upper corner 313. On the other hand, those portions of the first and second layers of metal fill material 321, 322 on the lower sidewalls 312L and bottom surface 312b of the opening 312—which may have been shielded from the effects of the angled ion beam etching process 340—may remain substantially in place. Moreover, depending on the specific etching parameters used for the angled ion beam etching process 340, the opening size 313d proximate the upper corner 313 may be greater than the opening size 312d proximate the bottom 312b of the opening 312, which in some embodiments may facilitate easier deposition of any subsequent layers of metal fill material in the opening 312. Thereafter, processing of the semiconductor device 300 may continue as described with respect to semiconductor device 200 above.

Figure 4A:
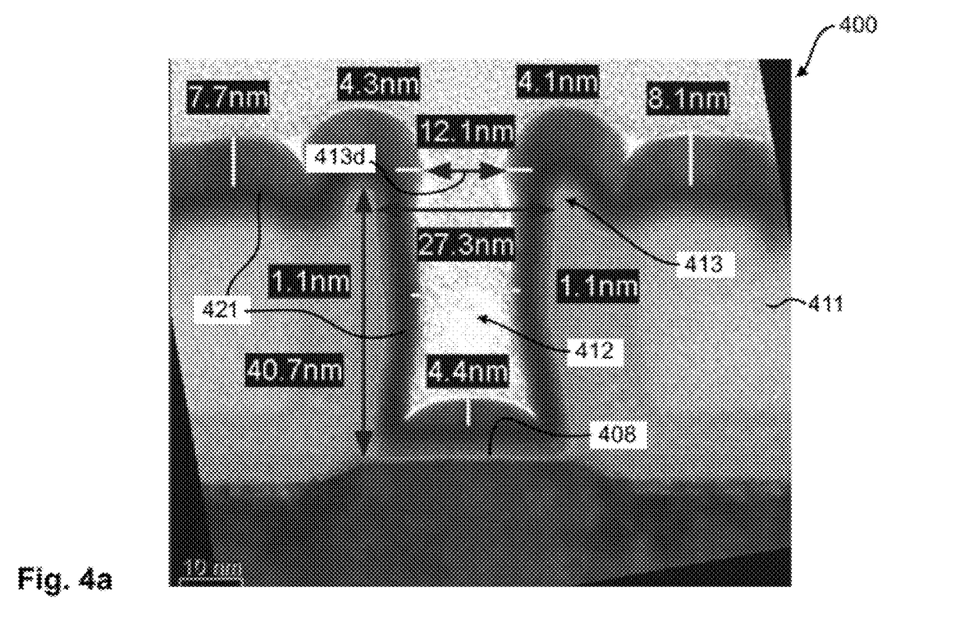
FIGS. 4a-4b are transmission electron microscopy (TEM) photographs of one demonstrative example of a replacement PMOS gate electrode structure that has been exposed to at least some of the illustrative manufacturing steps disclosed herein.
Figure 4B:
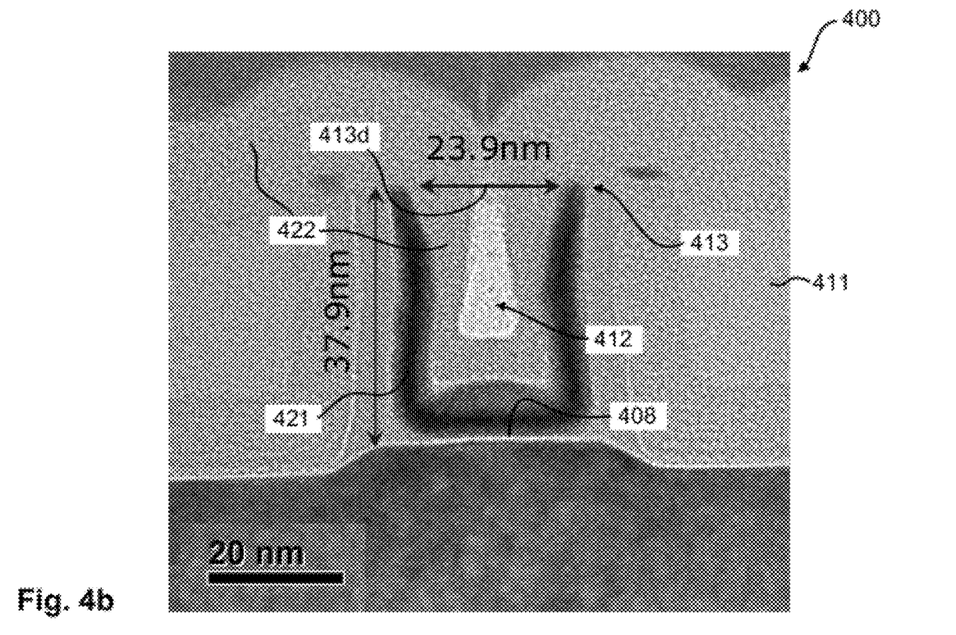

FIGS. 4a-4b, which are transmission electron microscopy (TEM) photographs of one demonstrative example of a replacement PMOS gate electrode structure that has been exposed to at least some of the illustrative manufacturing steps disclosed herein, will now be described.

FIG. 4a shows a semiconductor device 400 with an opening 412 formed in an interlayer dielectric material layer 411. In the specific application shown, the opening 412 has a width of approximately 27.3 nm and a depth of approximately 40.7 nm prior to the deposition of any layers of metal fill material. As shown in FIG. 4a, a first layer of metal fill material 421 has been formed above the semiconductor device 400, including above the interlayer dielectric material layer 411 and inside of the opening 412, resulting in an as-formed thickness on the sidewalls of the opening 412 of approximately 1.1 nm. FIG. 4a also shows an increased thickness of the first layer of metal fill material 421 around the upper corner 413, which reduces the opening size 413d proximate the upper corner 413 to approximately 12.1 nm.

FIG. 4b shows the PMOS gate electrode structure of the semiconductor device 400 shown in FIG. 4a after an angled ion beam etching process has been performed to remove a portion of the first layer of metal fill material 421. Additionally, a second layer of metal fill material 422 has been formed above the semiconductor device 400 and inside the opening 412. In the specific application depicted in FIG. 4b, the angled ion beam etching process was performed for approximately 120 second at an angle of approximately 70 relative to perpendicular, using a power setting of approximately 400 volts (DC) and an argon pressure of approximately $1 \times 10^{-4}$ torr. As shown in FIG. 4b, the first layer of metal fill material 421 has been substantially removed from above the interlayer dielectric material layer 411, and the opening size 413d proximate the upper corner 413 has been substantially increased from approximately 12.1 nm (see FIG. 4a) to approximately 23.9 nm. Furthermore, the depth of the opening 412 has slightly decreased from approximately 40.7 nm (see FIG. 4b) to approximately 37.9 nm.

Figure 5:
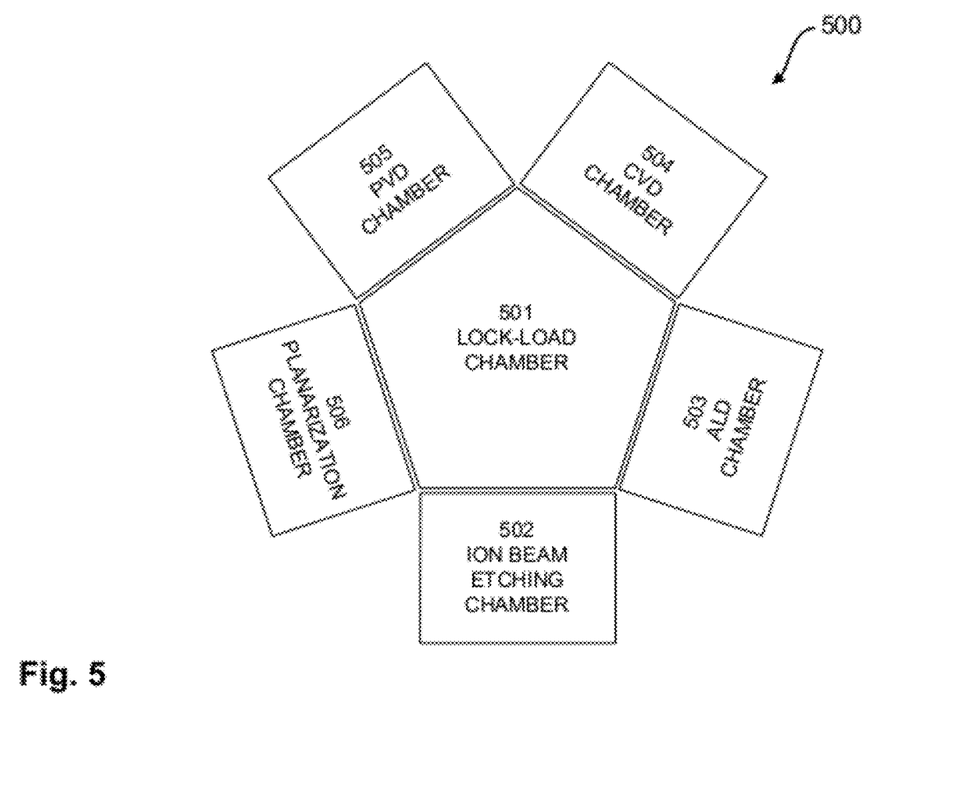
FIG. 5 schematically illustrates an illustrative processing tool used for performing one or more embodiments of the illustrative process flows disclosed herein.

FIG. 5 shows a schematic view of an illustrative semiconductor device manufacturing tool 500 which may be used to implement one or more of the techniques described with respect to FIGS. 2a-2g and FIGS. 3a-3b above. As shown in FIG. 5, the manufacturing tool 500 may comprise multiple processing chambers, such as for example, a lock-load chamber 501, an ion beam etching chamber 502, multiple deposition chambers 503-505, and a planarization chamber 506. Depending on the overall desired processing strategy, the multiple deposition chambers 503-505 may include an ALD chamber 503, a CVD chamber 504, PVD chamber 505, and the like. Other types of deposition chambers may also be used.

During the processing of a semiconductor device in accordance with techniques disclosed herein, a wafer comprising a semiconductor device that substantially corresponds to the semiconductor device 100 as illustrated in FIG. 1b—that is, after the dummy gate electrode 109 ha been removed—may be moved from the lock-load chamber 501 to a first deposition chamber, where a first layer of metal fill material may be deposited above the semiconductor device 100. Depending on work function control considerations (e.g., deposition process, material type, material thickness, etc.), the first deposition chamber may be any one of the multiple deposition chamber 503-505. In certain illustrative embodiments, the first deposition chamber may be the ALD chamber 503. After the deposition of a first layer of metal fill material, the semiconductor device 100 may then be moved back to the lock-load chamber 501. Once again, depending on the specific device processing strategy, the semiconductor device 100 may thereafter be moved from the lock-load chamber 501 to the ion beam etching chamber 502, where a first angled ion beam etching process may be performed to remove portions of the first layer of metal fill material. However, as outlined with respect to the embodiments illustrated in FIGS. 3a-3b and described above, the semiconductor device 100 may first be moved from the lock-load chamber 501 to another of the multiple deposition chambers 503-505, such as, for example, the CVD chamber 504, wherein a second layer of metal fill material may be deposited above the semiconductor device 100 before the device 100 is returned to the lock-load chamber 501, then subsequently moved to the ion beam etching chamber 502 for the angled ion beam etching process.

Therefore, depending on the desired overall processing sequence, the semiconductor device 100 may be moved from any one of the multiple deposition chambers 503-505 to any other of the multiple deposition chambers 503-505 via the lock-load chamber 501, or it may be moved from any one of the multiple deposition chambers 503-505 to the ion beam etching chamber 502 via the lock-load chamber 501 so as to form a multilayer metal fill inside of an opening of a semiconductor device in accordance with the techniques disclosed herein. Once the opening has been completely filled with the multilayer metal fill, the semiconductor device 100 may thereafter be moved to the planarization chamber 506 so as to remove excess material of the multilayer metal film from above the semiconductor device, and thereby form a replacement metal gate electrode.

As a result, the subject matter disclosed herein provides techniques and devices for forming multilayer metal fill materials in semiconductor device openings. While these techniques may be of particular advantage for device openings wherein the critical dimension of the opening may be 30 nm, 20 nm, or even less, the techniques may be successfully employed for device openings have significantly larger critical dimensions. Moreover, while some of the embodiments discussed above are directed to replacement metal gate electrodes, the techniques disclosed herein may also be applied to multilayer metal fills formed in device openings irrespective of the opening type—that is, they may also be used for contact via openings, deep trench openings, and similar structures, as well as openings for replacement gate electrodes.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
    forming an opening in a dielectric material layer of a semiconductor device formed above a semiconductor substrate, wherein said opening comprises an inlet, a bottom surface, upper sidewalls proximate said inlet, and lower sidewalls proximate said bottom surface;
    forming a first layer of first fill material above said semiconductor device, inside said opening, and at least above said upper and lower sidewalls and above said bottom surface of said opening;
    performing a first angled etching process to at least partially remove a portion of said first layer of first fill material from above said upper sidewalls, an etch angle of said first angled etching process being adjusted to substantially shield said lower sidewalls and said bottom surface of said opening from said first angled etching process; and
    forming a second layer of second fill material above said first layer of first fill material.

2. The method of claim 1, wherein performing said first angled etching process comprises rotating said semiconductor device about an axis that is substantially perpendicular to a plane of said semiconductor substrate and performing an angled ion beam etching process while said semiconductor device is rotating.

3. The method of claim 1, wherein performing said first angled etching process comprises performing an etching process at an angle from 45° and 89° relative to a vertical axis of said opening.

4. The method of claim 1, wherein said first angled etching process is performed after forming said second layer of second fill material.

5. The method of claim 1, wherein said second layer of second fill material is formed above said first layer of first fill material after performing said first angled etching process.

6. The method of claim 5, further comprising performing a second angled etching process to at least partially remove a portion of said second layer of second fill material from above said upper sidewalls, wherein an etch angle of said second angled etching process is adjusted to substantially shield said lower sidewalls and said bottom surface from said second angled etching process.

7. The method of claim 1, wherein performing said first angled etching process further comprises partially removing a portion of said second layer of second fill material from above said upper sidewalls.

8. The method of claim 1, wherein forming at least one of said first and second layers comprises performing a conformal deposition process.

9. The method of claim 8, wherein performing said conformal deposition process comprises performing at least one of an atomic layer deposition process, a chemical vapor deposition process and a physical vapor deposition process.

10. The method of claim 1, wherein said first fill material comprises a different material than said second fill material.

11. The method of claim 10, wherein said first and second fill materials comprise one of titanium, aluminum, platinum, rubidium, iridium, titanium nitride, titanium oxynitride, titanium oxycarbide, titanium oxycarbonitride, titanium aluminum, hafnium nitride, hafnium silicide, hafnium silicon nitride, tantalum carbide and tantalum nitride.

12. The method of claim 1, further comprising forming a third layer of third fill material above said semiconductor device to completely fill said opening.

13. A method for forming a multilayer replacement metal gate electrode of a semiconductor device, comprising:
    removing a dummy gate electrode from above a semiconductor substrate to form an opening in a dielectric layer of said semiconductor device;
    forming a plurality of metal fill material layers in said opening, wherein one or more of said plurality of metal fill material layers comprises an upper portion formed above sidewall surfaces of said opening proximate an inlet thereof and a lower portion formed above a bottom surface of said opening and above sidewall surfaces proximate said bottom surface;
    performing an angled ion beam etching process after forming each of said plurality of metal fill material layers except a last of said layers to at least partially remove each of said upper portions;

performing a planarization process after forming a last of said plurality of metal fill material layers.

14. The method of claim 13, further comprising adjusting an etch angle of each of said angled ion beam etching processes to substantially shield at least each of said lower portions from each of said angled ion beam etching processes.

15. The method of claim 13, wherein performing each of said angled ion beam etching processes comprises performing an ion beam etching process at an angle from 45° and 89° relative to a vertical axis of said opening.

16. The method of claim 13, wherein consecutively formed metal fill material layers comprise different material compositions.

17. The method of claim 13, wherein each of said plurality of metal fill material layers comprise one of titanium, aluminum, platinum, rubidium, iridium, titanium nitride, titanium oxynitride, titanium oxycarbide, titanium oxycarbonitride, titanium aluminum, hafnium nitride, hafnium silicide, hafnium silicon nitride, tantalum carbide and tantalum nitride.

18. The method of claim 13, wherein performing said planarization process comprises performing a chemical mechanical polishing process.

19. A method for using a semiconductor processing tool to form a multilayer metal fill in an opening of a semiconductor device, comprising:
  positioning a semiconductor wafer comprising said semiconductor device in a first one of a plurality of deposition chambers of said semiconductor processing tool;
  depositing a first metal material layer above said semiconductor device in said first one of said plurality of deposition chambers;
  positioning said semiconductor wafer in an ion beam etching chamber of said semiconductor processing tool, wherein said ion beam etching chamber is adapted to perform an angled etching process;
  performing an angled ion beam etching process to remove at least a portion of said first metal material layer;
  positioning said semiconductor wafer in a second one of said plurality of deposition chambers; and
  depositing a second metal material layer above said semiconductor device in said second one of said plurality of deposition chambers.

20. The method of claim 19, wherein said portion of said first metal material layer is removed prior to depositing said second metal material layer.

21. The method of claim 20, further comprising positioning said semiconductor wafer in said ion beam etching chamber after depositing said second metal material layer, and performing an angled ion beam etching process to remove at least a portion of said second metal material layer.

22. The method of claim 19, wherein said semiconductor wafer is positioned in said ion beam etching chamber after depositing said second metal material layer, and at least a portion of said second metal material layer is removed during said angled ion beam etching process.

23. The method of claim 19, wherein at least one of said plurality deposition chambers comprises one of an atomic layer deposition chamber, a chemical vapor deposition chamber and a physical vapor deposition chamber.

24. A method, comprising:
  forming an opening in a dielectric material layer of a semiconductor device formed above a semiconductor substrate, wherein said opening comprises an inlet, a bottom surface, upper sidewalls proximate said inlet, and lower sidewalls proximate said bottom surface;
  forming a first layer of first fill material above said semiconductor device, inside said opening, and at least above said upper and lower sidewalls and above said bottom surface of said opening;
  performing a first angled etching process to at least partially remove a portion of said first layer of first fill material from above said upper sidewalls, wherein performing said first angled etching process comprises rotating said semiconductor device about an axis that is substantially perpendicular to a plane of said semiconductor substrate and performing an angled ion beam etching process while said semiconductor device is rotating; and
  forming a second layer of second fill material above said first layer of first fill material.

* * * * *